(12) United States Patent
Chan et al.

(10) Patent No.: US 9,043,688 B1
(45) Date of Patent: May 26, 2015

(54) ERROR DATA GENERATION AND APPLICATION FOR DISK DRIVE APPLICATIONS

(75) Inventors: Kai Keung Chan, Fremont, CA (US); Xin-Ning Song, San Jose, CA (US); Jason Bellorado, Santa Clara, CA (US); Kwok W. Yeung, Milpitas, CA (US)

(73) Assignee: SK hynix memory solutions inc., San Jose, CA (US)

( * ) Notice: Subject to any disclaimer, the term of this patent is extended or adjusted under 35 U.S.C. 154(b) by 281 days.

(21) Appl. No.: 13/427,599

(22) Filed: Mar. 22, 2012

Related U.S. Application Data

(60) Provisional application No. 61/467,927, filed on Mar. 25, 2011.

(51) Int. Cl.
*H03M 13/03* (2006.01)
*H03M 13/41* (2006.01)
*H04L 1/00* (2006.01)
*G11B 20/10* (2006.01)
*H03M 13/29* (2006.01)

(52) U.S. Cl.
CPC .......... *H03M 13/41* (2013.01); *H03M 13/4107* (2013.01); *H04L 1/0054* (2013.01); *G11B 20/10009* (2013.01); *H03M 13/2957* (2013.01); *H04L 1/0059* (2013.01)

(58) Field of Classification Search
CPC ............ H03M 13/41; H03M 13/4107; H03M 13/4161; H04L 1/005; H04L 1/0054; H04L 2201/06
USPC .......... 714/795, 786, 794, 796; 375/262, 341; 704/242
See application file for complete search history.

(56) References Cited

U.S. PATENT DOCUMENTS

| | | | |
|---|---|---|---|
| 5,961,658 A * | 10/1999 | Reed et al. ..................... | 714/746 |
| 6,044,439 A * | 3/2000 | Ballard et al. ................ | 711/137 |
| 6,513,141 B1 * | 1/2003 | Livingston .................... | 714/792 |
| 7,124,328 B2 * | 10/2006 | Bowers et al. ................. | 714/39 |
| 8,181,081 B1 * | 5/2012 | Yeo et al. ...................... | 714/752 |
| 8,291,285 B1 * | 10/2012 | Varnica et al. ................ | 714/752 |
| 8,296,637 B1 * | 10/2012 | Varnica et al. ................ | 714/794 |
| 8,495,458 B1 * | 7/2013 | Song et al. .................... | 714/758 |
| 2004/0076245 A1 * | 4/2004 | Okamoto et al. ............. | 375/341 |
| 2004/0267947 A1 * | 12/2004 | Sheahan et al. ............... | 709/230 |
| 2005/0273688 A1 * | 12/2005 | Argon ........................... | 714/755 |
| 2008/0098288 A1 * | 4/2008 | Yang et al. .................... | 714/796 |
| 2008/0118012 A1 * | 5/2008 | Corke et al. .................. | 375/348 |
| 2008/0235559 A1 * | 9/2008 | Yang ............................. | 714/758 |
| 2008/0276156 A1 | 11/2008 | Gunnam et al. | |
| 2008/0301521 A1 | 12/2008 | Gunnam et al. | |
| 2009/0070658 A1 * | 3/2009 | Patapoutian et al. ......... | 714/795 |
| 2009/0150746 A1 * | 6/2009 | Chaichanavong et al. .... | 714/752 |
| 2013/0223199 A1 * | 8/2013 | Lund et al. ................. | 369/53.44 |

* cited by examiner

*Primary Examiner* — Albert Decady
*Assistant Examiner* — Osman Alshack
(74) *Attorney, Agent, or Firm* — Van Pelt, Yi & James LLP

(57) ABSTRACT

Generating error data associated with decoding data is disclosed, including: processing an input sequence of samples associated with data stored on media using a detector and a decoder during a global iteration; and generating one or more error values based at least in part on one or more decision bits output by the detector or the decoder and the input sequence of samples.

19 Claims, 13 Drawing Sheets

ERROR DATA GENERATION AND APPLICATION FOR DISK DRIVE APPLICATIONS

CROSS REFERENCE TO OTHER APPLICATIONS

This application claims priority to U.S. Provisional Patent Application No. 61/467,927 entitled INTER-TRACK INTERFERENCE (ITI) COEFFICIENTS ADAPTATION FOR DISK DRIVE APPLICATIONS filed Mar. 25, 2011 which is incorporated herein by reference for all purposes.

BACKGROUND OF THE INVENTION

Conventionally, signals associated with data stored on media (e.g., hard disk) are processed by a receiver in a feed forward system. For example, the input signal read from storage media can be input in a detector and the outputs of the detector can be input into the decoder. The outputs of the decoder can then be used for further processing in the effort to successfully decode the signal read from the media. In some feed forward systems, an error signal is used to perform corrections or adjustments. It would be desirable if new techniques for generating error signals could be developed, for example, in iterative decoding systems.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
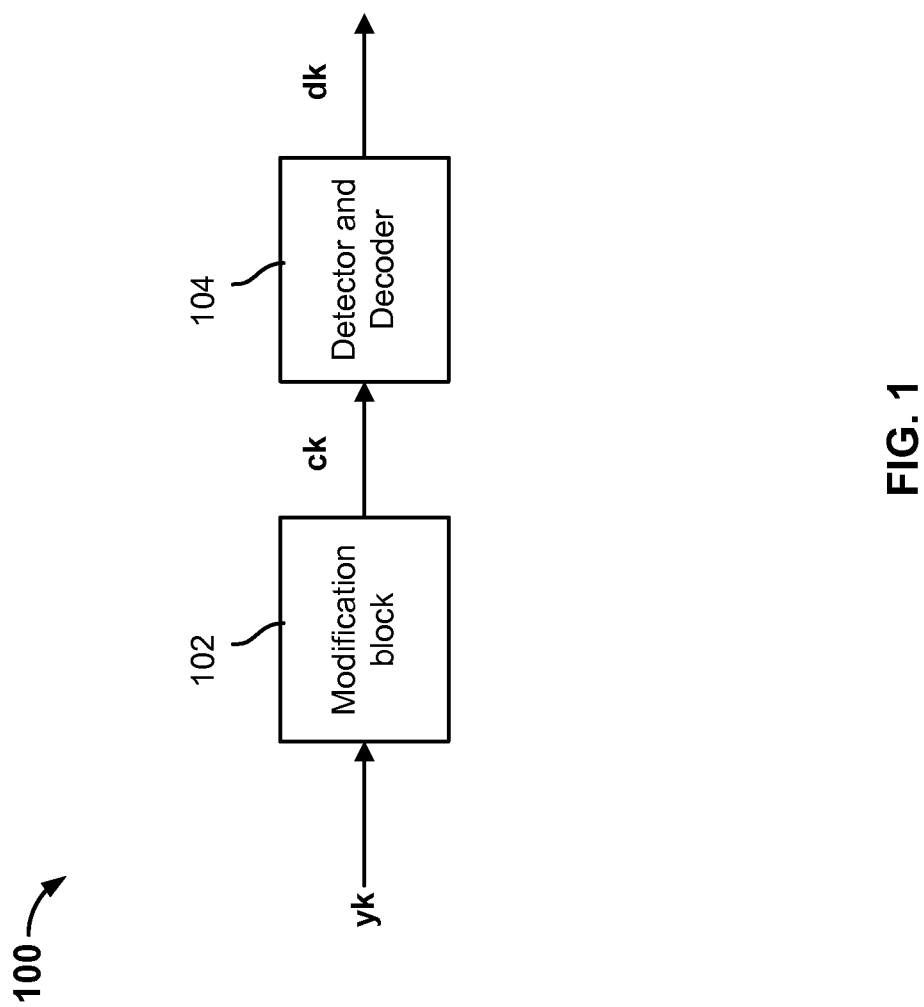
FIG. 1 is a diagram showing an example of a typical feed forward system.

FIG. 1 is a diagram showing an example of a typical feed forward system. In some embodiments, system 100 is configured to be associated with a hard drive controller. For example, system 100 can be used to read data from media such as hard disk. In the example, a signal received for a data sector being read is processed by an analog process (not shown) and then equalized (e.g., by one or more filters) to become yk, an input sequence of samples. yk could be stored and read from a memory (not shown). Modification block 102 is optionally included in system 100. Modification block 102 can represent any processing (e.g., a recovery process) that is used to modify input sequence of samples yk into modified sequence of samples ck. Modified sequence of samples ck is fed into detector and decoder 104. If modification block 102 were not included in system 100, then modified sequence of samples ck would be the same as the unmodified, input sequence of samples yk. As a result of processing the modified sequence of samples ck, decision sequence dk is output and/or a determination regarding whether input sequence of samples yk can be successfully decoded is made (e.g., if input sequence of samples yk is successfully decoded, then an error correction code word can be successfully determined). In the event that input sequence of samples yk cannot be successfully decoded, decision sequence dk can then be fed into one more other loops (e.g., timing loop, gain loop, and/or offset loop).

A technique of iteratively generating error data from detector and decoder outputs is disclosed. In some embodiments, the error data is iteratively generated from the detector and decoder outputs and also iteratively used to adapt at least a portion of the sequence of samples that is to be input into a detector and a decoder so as to continuously improve the accuracy of input data and the likelihood that such data will be correctly decoded. In some embodiments, the generation of error data and/or use of error data to adapt the input sequence are scheduled based on one or more timing schemes. For example, different scheduling schemes may be based at least in part on the tradeoff between successfully decoding the input sequence faster and minimizing power consumption.

Figure 2:
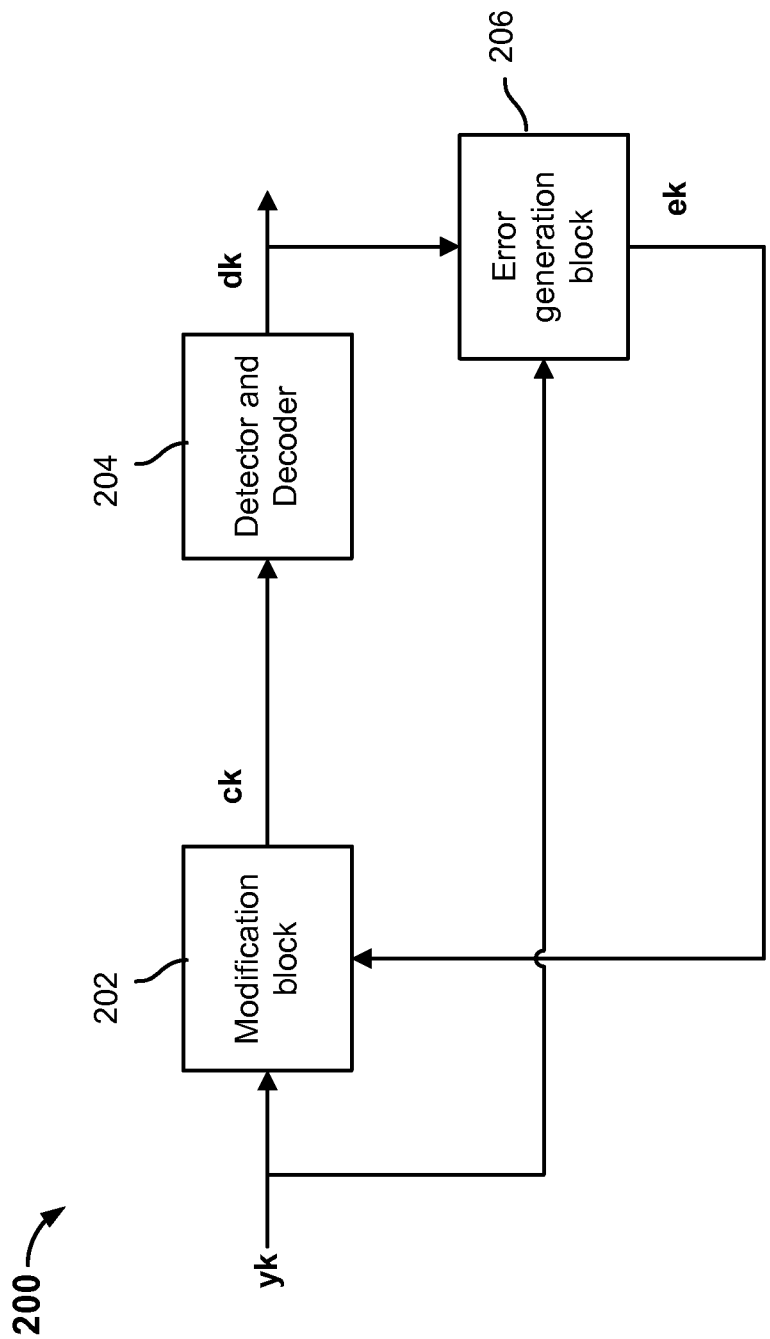
FIG. 2 is a diagram showing an embodiment of a system for generating an error signal in an iterative decoding system.

FIG. 2 is a diagram showing an embodiment of a system for generating an error signal in an iterative decoding system. In some embodiments, system 200 is configured to be associated with a hard drive controller. For example, system 200 is used to read data from media such as hard disk. In the example, a signal received for a data sector being read is processed by an analog process (not shown) and then equalized (e.g., by one or more filters) to become yk, an input sequence of samples. In some embodiments, yk is stored and read from a memory (not shown). Unlike system 100, system 200 includes error generation block 206. In various embodiments, error generation block 206 is implemented using one or both of hardware and software. Error generation block 206 is configured to generate error sequence ek using decision sequence dk outputted by detector and decoder 204 and also input sequence of samples yk (e.g., retrieved from a memory). Modification block 202 is optionally included in system 200. In various embodiments, modification block 202 is implemented using one or both of hardware and software. If modification block 202 were not included in system 200, then modified sequence of samples ck would be the same as the unmodified, input sequence of samples yk. Modification block 202 is configured to use at least error sequence ek, once it is available, to modify at least a portion of input sequence of samples yk to produce a series of modified samples, modified sequence of samples ck. In some embodiments, when error sequence ek is not available, modification block 202, even if included in system 200, will not modify/adapt input sequence of samples yk. An example of when error sequence ek is not available is during the first global iteration of processing before detector and decoder 204 outputs any decision bits to be received by error generation block 206. Another example of when error sequence ek is not available is when an event associated with the start of error data generation and adaptation has not yet occurred. In some embodiments, modification block 202 is configured to perform other modifications to input sequence of samples yk in addition to adapting it to error sequence ek.

In various embodiments, a global iteration refers to the processing (e.g., of an entire sequence of samples, such as modified sequence of samples ck) by both a detector and/or decoder of detector and decoder 204. In some embodiments, input sequence of samples yk (and modified sequence of samples ck, which is a modified version of yk) is associated with a hard disk sector's worth of data, which is approximately 40,000 bits in length. So a global iteration of detector and decoder 204 refers to detector and decoder 204 processing all the 40,000 or so bits that comprise modified sequence of samples ck. As detector and decoder 204 is processing modified sequence of samples ck in a global iteration, detector and decoder 204 is configured to output a series of decision bits, decision sequence dk (or probabilities thereof), produced based on the processed portions of modified sequence of samples ck. An example of the detector of detector and decoder 204 is a soft output Viterbi Algorithm (SOVA) detector. An example of the decoder of detector and decoder 204 is a low-density parity-code (LDPC) decoder. Each decision bit output by a SOVA and/or a LDPC is a decided bit ("1" or "0") and also a corresponding probability (e.g., the probability that a particular bit is "1" is 99%).

In some embodiments, at least a portion of decision sequence dk output from detector and decoder 204 is fed into error generation block 206 to generate error sequence ek. In some embodiments, bits of decision sequence dk are fed into error generation block 206 as they are output by detector and decoder 204. In some embodiments, error generation block 206 is configured to start generating error sequence ek using decision sequence dk and input sequence of samples yk, as bits of decision sequence dk become available. In some embodiments, error sequence ek is sent to modification block 202 to be used to adapt/modify input sequence of samples yk to produce more accurate data (i.e., modified sequence of samples ck is modified to be closer to the expected/desired/correct sequence of data). Modified sequence of samples ck is then fed into detector and decoder 204 to produce decision sequence dk, which will be fed into error generation block 206 to generate error sequence ek to feed back into modification block 202, and so forth.

As such, each successive modified sequence of samples ck will be more accurate than the modified sequence of samples ck of the previous global iteration by virtue of being iteratively corrected with the error data generated from the decision bits from a previous global iteration of detector and decoder processing. Then, in each successive global iteration, modified sequence samples ck will become more accurate and successive iterations of decision sequence dk will also become more accurate, thereby decreasing the error over time and increasing the likelihood that the input sequence of samples yk will be successfully decoded in a subsequent global iteration. By using the output of the detector and decoder from one global iteration to generate error data to improve the processing of a subsequent global iteration, the feedback of one iteration of detector and decoder processing a read back signal can be used for the benefit of subsequent detecting and decoding of that same signal to improve its chances of being successfully decoded.

In some embodiments, parameters associated with system 200 and/or the hard disk controller thereof can be configured to determined if/when error data generation and/or error adaptation is to be performed with respect to one or more global iterations of detecting and decoding input sequence of samples yk.

In some embodiments, detector and decoder 204 continuously processes modified sequence of samples ck over one global iteration after another but stops when the decoder of detector and decoder 204 determines that the data is successfully decoded, in which case error generation block 206 and modification block 202 are also configured to stop processing.

Figure 3:
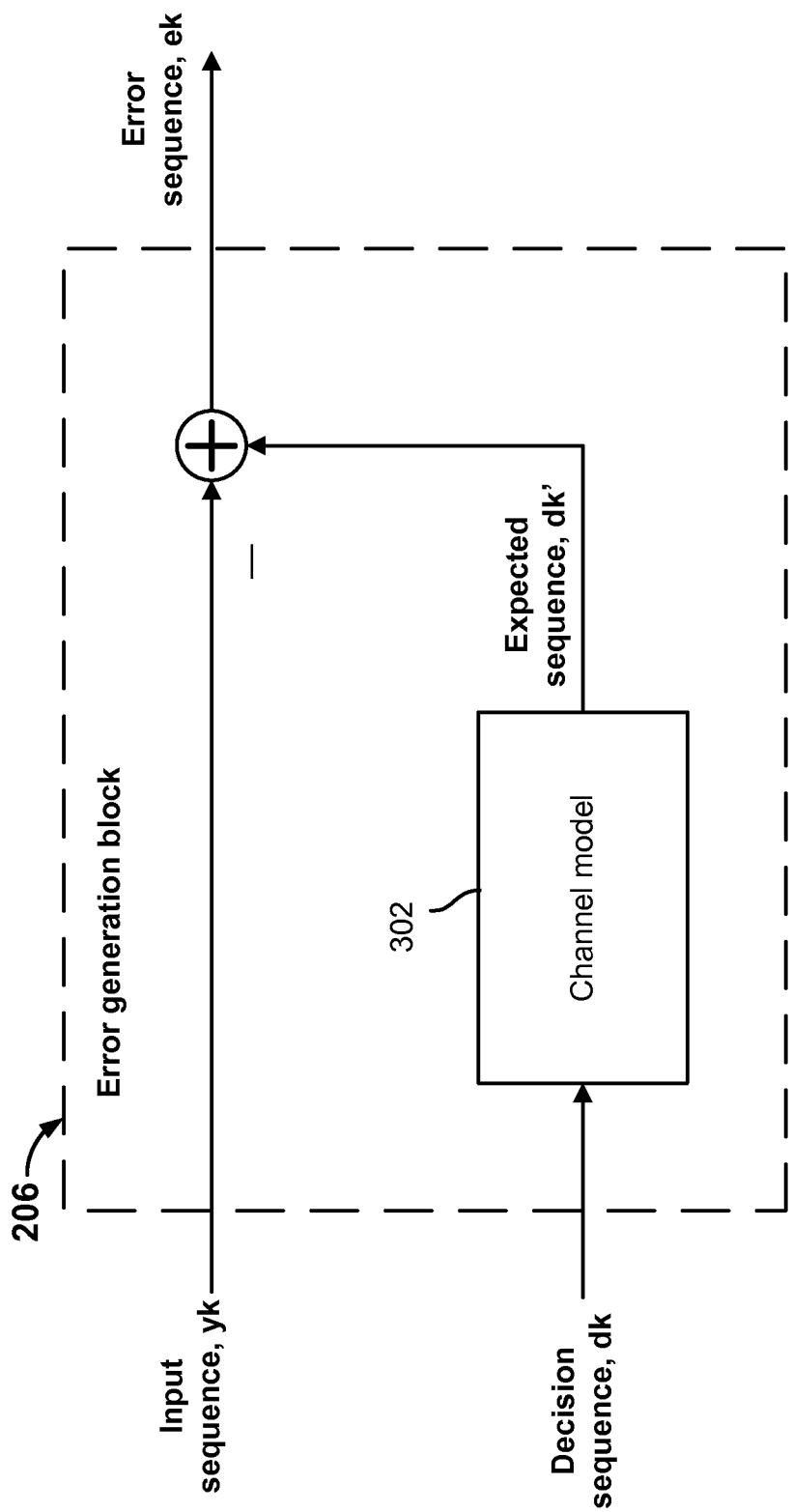
FIG. 3 is a diagram showing an example of an error generation block.

FIG. 3 is a diagram showing an example of an error generation block. In some embodiments, error generation block 206 of system 200 can be implemented using the example. As shown in the example, the two inputs into the error generation block are input sequence of samples yk (e.g., the samples could be read from memory) and decision sequence dk (which are output by a detector and decoder such as detector and decoder 204 of system 200). Decision sequence dk is fed into channel model 302 to be processed into expected sequence dk'. Channel model 302 can be linear (e.g., a filter) or non-linear (e.g., a look-up table). In some embodiments, channel model 302 is configured to use one or more bits of decision sequence dk to generate each bit of expected sequence dk'. For example, channel model 302 can use a sliding window of bits of decision sequence dk to generate each bit of expected sequence dk'. In this example, error sequence ek is produced by taking the difference of the determined expected sequence dk' and input sequence of samples yk. As mentioned above, the generated error sequence ek can be used to adapt input sequence of samples yk (e.g., in a modification block) to be more accurate for subsequent one or more global iterations of detector and decoder processing.

Figure 4:
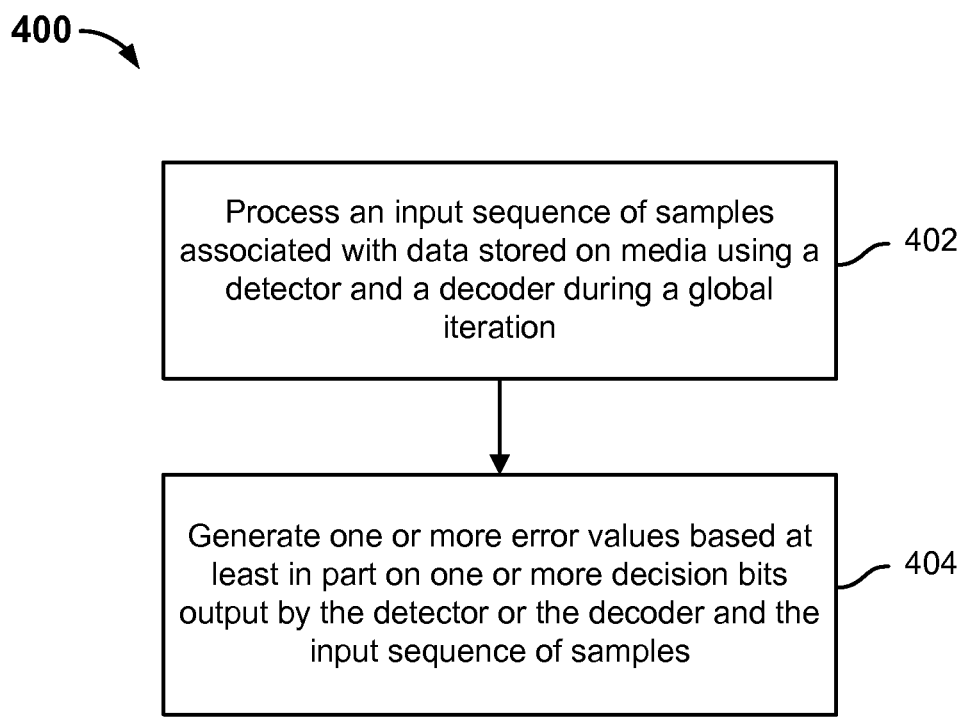
FIG. 4 is a flow diagram showing an embodiment of a process for generating error data associated with signals read from storage media.

FIG. 4 is a flow diagram showing an embodiment of a process for generating error data associated with signals read from storage media. In some embodiments, process 400 is implemented at system 200.

At 402, an input sequence of samples associated with data stored on media is processed using a detector and a decoder during a global iteration.

In some embodiments, the media comprises hard disk. In some embodiments, data is stored on the media and such stored data is read by a system such as system 200. In some embodiments, when the stored data is read (e.g., the data stored on a data sector is read), an analog signal is captured, processed through one or more analog processes, (optionally) equalized, and converted into a digital sequence of samples. The sequence of samples is input to at least a detector (e.g., SOVA) and a decoder (e.g., LDPC) to be processed over at least one global iteration. In some embodiments, the detector and decoder continuously process the input sequence of samples over one global iteration after another until the decoder determines that the data can be successfully decoded. In some embodiments, for each global iteration, the entire input sequence of samples is processed by the detector and decoder. In some embodiments, the detector and decoder output a sequence of decision bits (sometimes referred to as a "decision sequence") as it is processing the input sequence of samples. In some embodiments, the decision sequence is sent to an error generation block as it is being output by the detector and decoder.

At 404, one or more error values are generated based at least in part on one or more decision bits output by the detector or the decoder and the input sequence of samples.

In some embodiments, the decision sequence is fed into the error generation block, which generates one or more error values (an error sequence) based at least on the decision sequence. In some embodiments, the error generation block uses at least a portion of the decision sequence and also at least a portion of the input sequence to generate the one or more error values. In some embodiments, at least a portion of the decision sequence is used to determine an expected/desired/correct sequence and the difference between the input sequence of samples and the at least portion of the expected/desired/correct sequence is taken to be the one or more generated error values and the input sequence of samples. In some embodiments, one or more error values are generated (sometimes, concurrently/simultaneously) as the detector and decoder is processing the input sequence of samples over one or more global iterations, until, for example, the detector and decoder stops processing the input sequence. For example, the detector and decoder can stop processing the input sequence when it is determined that the input sequence of samples can be successfully decoded.

In some embodiments, one or more error values are then used to adapt/modify/correct the input sequence of samples to improve their accuracy for the current global iteration of processing or a subsequent global iteration of processing, depending on when the error data generation and adaptation are configured to begin. In some embodiments, the initiation of error data generation and the immediate use of the generated error data for adaptation of the input samples can be configured to start at a configured time/event with respect to one or more global iterations of processing the input sequence of samples, as described below. In some embodiments, error data generation is configured to start as soon as one or more decision bits are output by the detector and decoder and the adaptation of input samples to the generated error data is separately configured to start at a time/event as early as when the first error value is generated or at a later time/event. However, in the examples of FIGS. 5 through 10, both error data generation and the adaptation of input samples to the generated error data are configured to start at the same time/event (e.g., adaptation is set to begin as soon as the generated error data becomes available).

In some embodiments, the time at which error is generated does not influence the power consumed. However, power would be saved if error data is not generated. So, in some embodiments, the timing schemes for when to generate error data and to use the error data to adapt/modify/correct the input sequence of samples can be configured such that error generation and adaptation is used only when normal operation (i.e., processing the input sequence of data without error generation) results in uncorrectable data.

Figure 5:
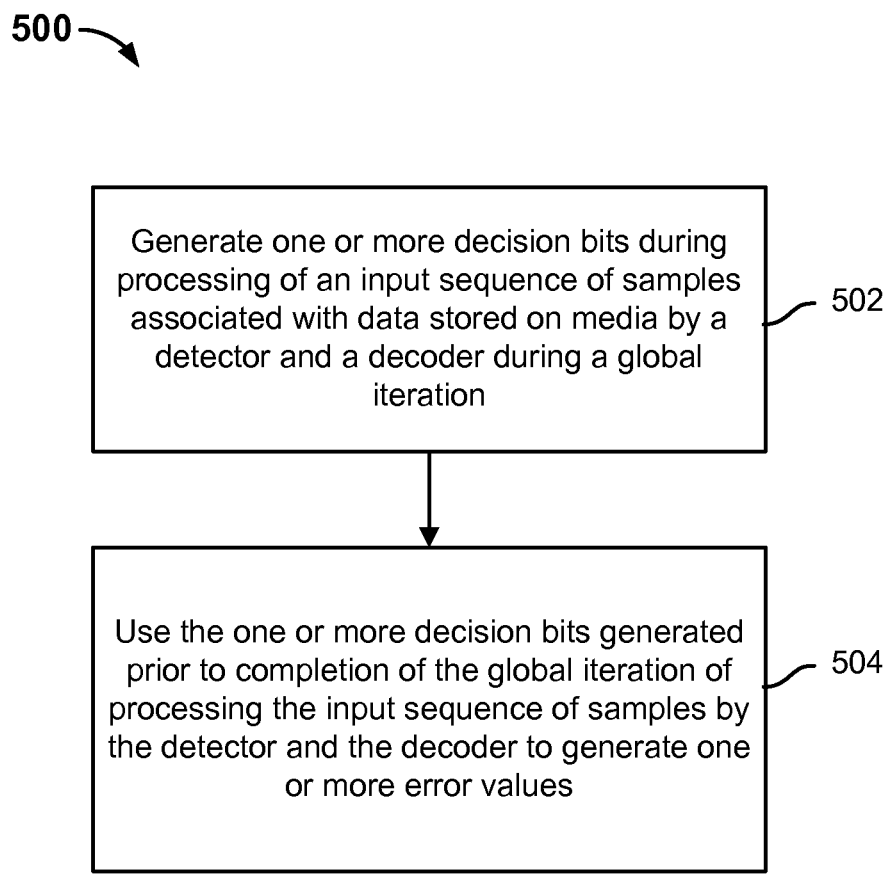
FIG. 5 is a flow diagram showing an embodiment of scheduling the generation of error data.

FIG. 5 is a flow diagram showing an embodiment of scheduling the generation of error data. In some embodiments, process 500 is implemented at system 200. In some embodiments, process 400 is implemented by process 500.

In some embodiments, system 200 is configurable to schedule the generation of error data in the manner described by process 500.

At 502, one or more decision bits are generated during processing of an input sequence of samples associated with data stored on media by a detector and a decoder during a global iteration.

In a global iteration of processing the input sequence of samples, the detector (e.g., SOVA) and/or the decoder (e.g., LDPC) produce a series of decision bits over time as they process the input sequence over one global iteration. For example, the SOVA detector can process an input sample and produce a soft output (e.g., a bit value and a corresponding probability) that is then fed into the LDPC decoder that uses such input to produce another output bit. In some embodiments, either the decision bits output by the detector or the decoder can be used to generate error data. Over the course of a global iteration (e.g., an input sequence of samples being completely processed by the detector and the decoder), a series of decision bits is continuously output based on the portion of the input sequence of samples that have already been processed by the detector and decoder.

At 504, the one or more decision bits generated prior to completion of the global iteration of processing the input sequence of samples by the detector and decoder are used to generate one or more error values.

While the input sequence of samples is being processed over the global iteration, the series of decision bit outputs can be continuously used to generate error data. Put another way, the decision bits output prior to the completion of the global iteration of processing are used to generate error data. The error data generated from the series of decision bits produced by less than a complete global iteration can, in some embodiments, be used to update the remainder of the input sequence of samples in that global iteration prior to feeding it into the detector and decoder for processing. For example, error data can be generated from as few as one decision bit output from the detector and decoder at a time (though more than one decision bit can also be used to generate error data) to adapt at least a portion of the input sequence of samples that is to be fed into the detector and decoder. This scheduling scheme provides an approximately "real-time" update to the input sequence by generating error data from decision bits immediately after they are available and then using the generated error data to adapt at least the remainder of the input sequence of samples to be processed within the same global iteration.

Process 500 permits the sooner generation of error data and also adaption of the input data to the generated error data, which could accomplish reaching successful data decoding in fewer global iterations of processing than would be required if error data generation and adaptation were not used. However, because process 500 generates error data constantly throughout each global iteration, it may also consume more power than a process that generates error data at a slower rate, such as process 700, as described below.

In some embodiments, process 500 can be repeated until the decoder determines that further global iterations will not be performed (e.g., the decoder determines that the input sequence has been successfully decoded).

Figure 6:
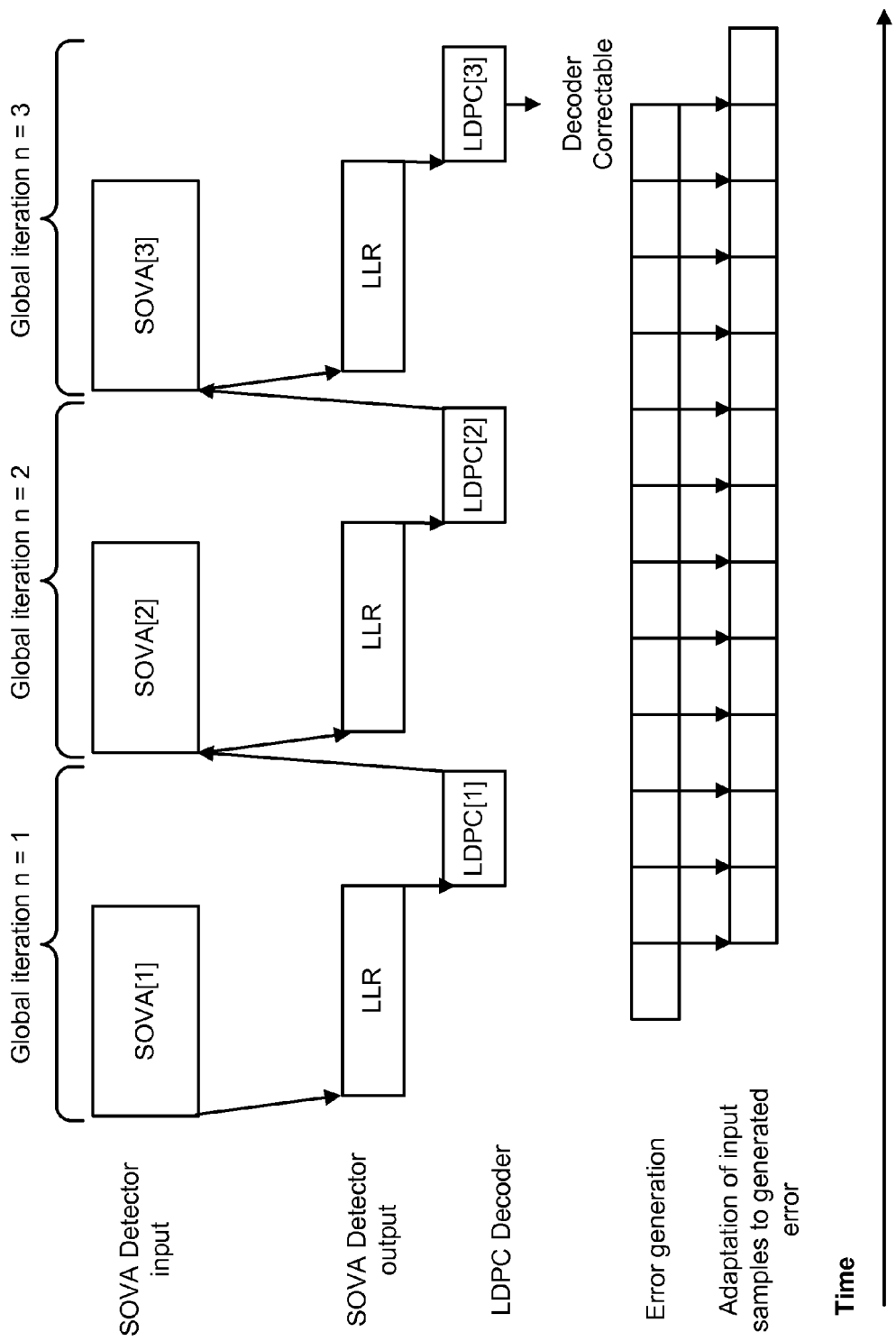
FIG. 6 is an embodiment of a time schedule diagram showing error data generation as described by process 500 and also the use of generated error data to adapt the input sequence of samples.

FIG. 6 is an embodiment of a time schedule diagram showing error data generation as described by process 500 and also the use of generated error data to adapt the input sequence of samples. In some embodiments, the example is implemented at system 200. In the example, the detector comprises a SOVA detector and the decoder comprises a LDPC decoder. In the example, SOVA[n] represents the SOVA detector processing at global iteration "n," where n is a natural number starting from 1. Also, LDPC[n] represents the LDPC decoder processing at global iteration "n," where n is a natural number starting from 1. As indicated in the diagram, time flows from left to right in the example.

In some embodiments, in a global iteration, the SOVA detector is configured to sequentially process each of one or more portions of an entire input sequence of samples. Furthermore, the SOVA detector is configured to process each successive sample in a portion of the input sequence of samples in sequence and similarly, sequentially output a decision bit for each processed sample. The stream of decision bits output from the SOVA detector over time is then sequentially fed to the LDPC decoder to be processed. In some embodiments, the LDPC decoder processes batches of decision bits output from the SOVA detector. In some embodiments, the decision outputs from the LDPC decoder can be input into the SOVA detector to modify the subsequent cycle of SOVA processing. As such, an entire global iteration can include one or more SOVA cycles and also one or more LDPC cycles. However, for illustrative purposes, in the time schedule diagrams of FIGS. 6, 8, and 10, all the processing by the SOVA detector for an entire input sequence of samples for global iteration n is represented by the time block labeled as "SOVA[n]" and all the processing by the LDPC detector for the entire input sequence samples for global iteration n is represented by the time block labeled as "LDPC[n]." Since a global iteration includes the entire input sequence of samples being processed by both the SOVA detector and the LDPC decoder, global iteration n spans at least both SOVA[n] and LDPC[n].

In the example, at the start of global iteration n=1, an input sequence of samples (e.g., retrieved from memory) is input in the SOVA detector for processing (SOVA[1]). Then the decision outputs from the SOVA[1] (log-likelihood ratio, LLR) are input into the LDPC for processing (LDPC[1]). As shown in the diagram, error data is being continuously generated during SOVA[1] and LDPC[1] (i.e., while global iteration n=1 is still ongoing), and the generated error data is then used to continuously adapt portions of the input sequence of samples to be fed into the SOVA detector and the LDPC decoder. In the example, the portions of the input sequence of samples that are adapted during global iteration n=1 include input samples associated with the global iteration n=1 that have not yet been processed by the SOVA detector and the LDPC decoder. In some embodiments, as soon as a decision bit is output by the SOVA detector based on processing a sample from the input sequence, that decision bit can be used to generate error data and then the generated error data can be used to adapt another sample that appears later in a portion of the input sequence that has not yet been processed by the SOVA detector. For example, a decision bit output by SOVA for the first sample of the input sequence can be used to generate error data that is to be used to adapt the $20^{th}$ sample of the input sequence before it is processed by the SOVA detector. In some other embodiments, at the end of each SOVA cycle, the set of decision bits output during that cycle is used to generate error data that is to be used to adapt another portion of the input sequence that is yet to be processed in a subsequent SOVA cycle.

In the example, SOVA detector and LDPC decoder perform processing over two more global iterations (n=2 and n=3), during which error data is continuously generated and used to continuously adapt the input sequence of samples in a manner similar to that described for global iteration n=1. At the end of LDPC[3], processing stops because the LDPC decoder determines that the data is correctable (i.e., the data is successfully decoded).

Figure 7:
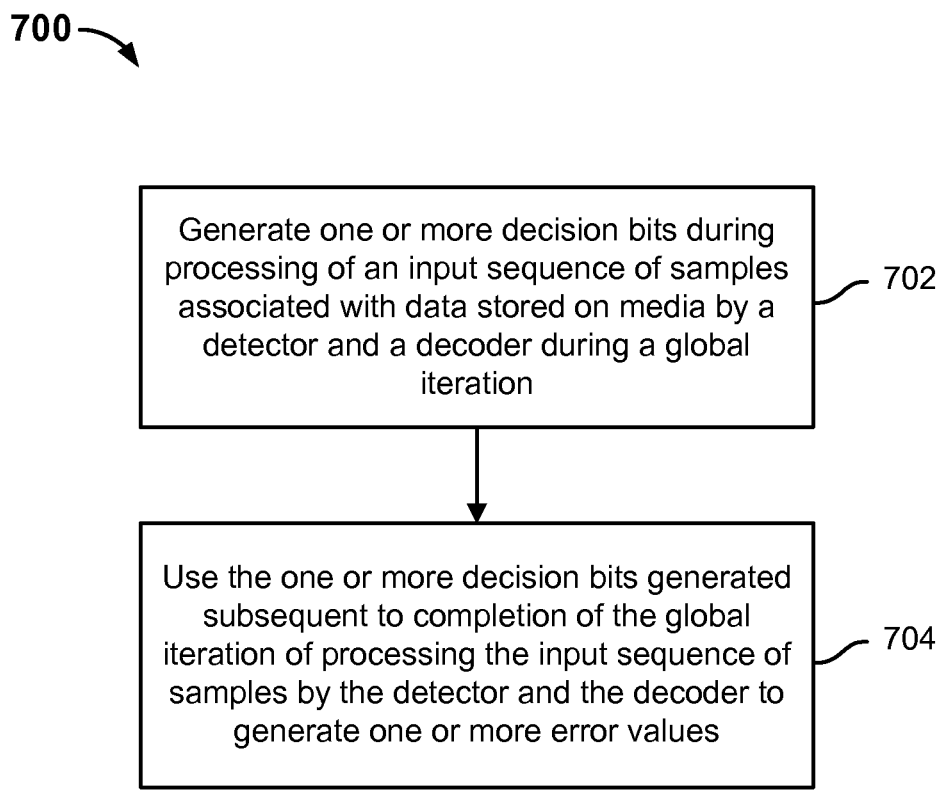
FIG. 7 is a flow diagram showing another embodiment of scheduling the generation of error data.

FIG. 7 is a flow diagram showing another embodiment of scheduling the generation of error data. In some embodiments, process 700 is implemented at system 200. In some embodiments, process 400 is implemented by process 700.

In some embodiments, system 200 is configurable to schedule the generation of error data in the manner described by process 700.

At 702, one or more decision bits are generated during processing of an input sequence of samples associated with data stored on media by a detector and a decoder during a global iteration.

In some embodiments, 702 is similar to 502.

At 704, the one or more decision bits generated subsequent to completion of the global iteration of processing the input sequence of samples by the detector and the decoder are used to generate one or more error values.

Unlike 504, in 704, decision bits generated from a global iteration of processing by the detector and decoder are not used to generate error data until the end of the global iteration. Then, in some embodiments, the decision bits generated from a completed global iteration are used to generate error data that is then used to adapt the input sequence of samples to be fed into the detector and decoder in a subsequent global iteration. In some embodiments, error data generated from the decision bits output for each global iteration is used to adapt the input sequence of samples in the immediately subsequent global iteration or a subsequent global iteration that is not necessarily the immediately subsequent global iteration.

Process 700 may accomplish reaching successful data decoding in more global iterations of processing than is required for process 500 because process 700 generates error data at a slower rate (i.e., process 700 generates error data after waiting for the end of each global iteration, as opposed to immediately during or after each SOVA cycle as described in process 500). However, for the same reason, process 700 may consume less power than process 500.

In some embodiments, process 700 can be repeated until the decoder determines that further global iterations will not be performed (e.g., the decoder determines that the input sequence has been successfully decoded).

Figure 8:
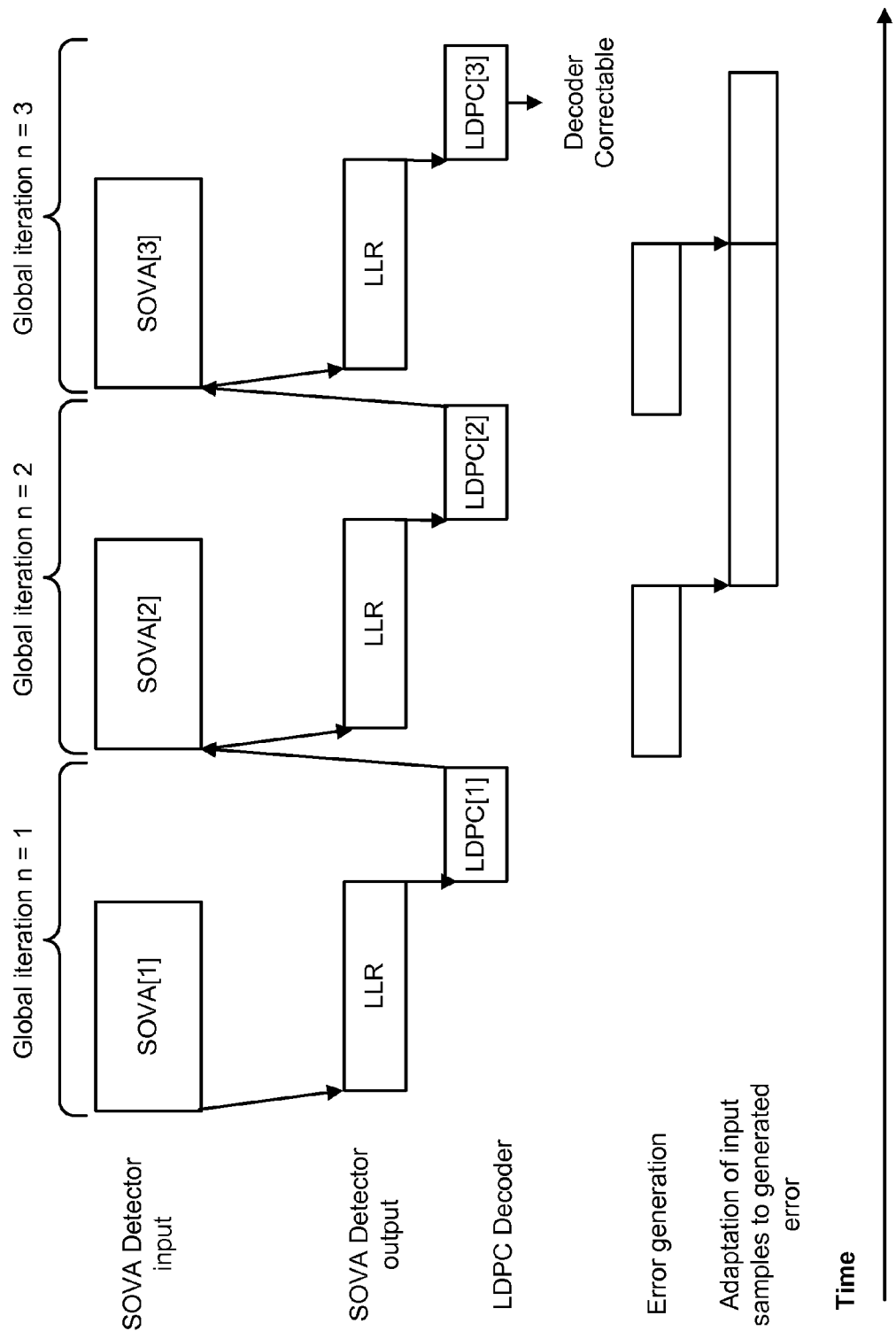
FIG. 8 is an embodiment of a time schedule diagram showing error data generation as described by process 700 and also the use of generated error data to adapt the input sequence of samples.

FIG. 8 is an embodiment of a time schedule diagram showing error data generation as described by process 700 and also the use of generated error data to adapt the input sequence of samples. In some embodiments, the example is implemented at system 200. In the example, the detector comprises a SOVA detector and the decoder comprises a LDPC decoder.

In the example, at the start of global iteration n=1, an input sequence of samples (e.g., retrieved from memory) is input in the SOVA detector for processing (SOVA[1]). Then the decision outputs from the SOVA[1] (LLR) are input into the LDPC for processing (LDPC[1]). As shown in the diagram, error data is being generated subsequent to LDPC[1] (i.e., error data is being generated at the end of global iteration n=1). The generated error data can then be used to adapt the input sequence of samples to be fed into the SOVA detector and LDPC decoder during at least a portion of a subsequent global iteration. In this example, the error data generated subsequent to the completion of global iteration n=1 is used to adapt at least a portion of the input sequence of samples to be processed during global iteration n=2.

In the example, SOVA detector and LDPC decoder perform processing over two more global iterations (n=2 and n=3). At the end of LDPC[2] (i.e., the end of global iteration n=2), error data is generated and used to adapt the input sequence of samples for a subsequent global iteration in a manner similar to that described for global iteration n=1. At the end of LDPC[3] (i.e., the end of global iteration n=3), processing stops because the LDPC decoder determines that the data is correctable (i.e., the data is successfully decoded).

Figure 9:
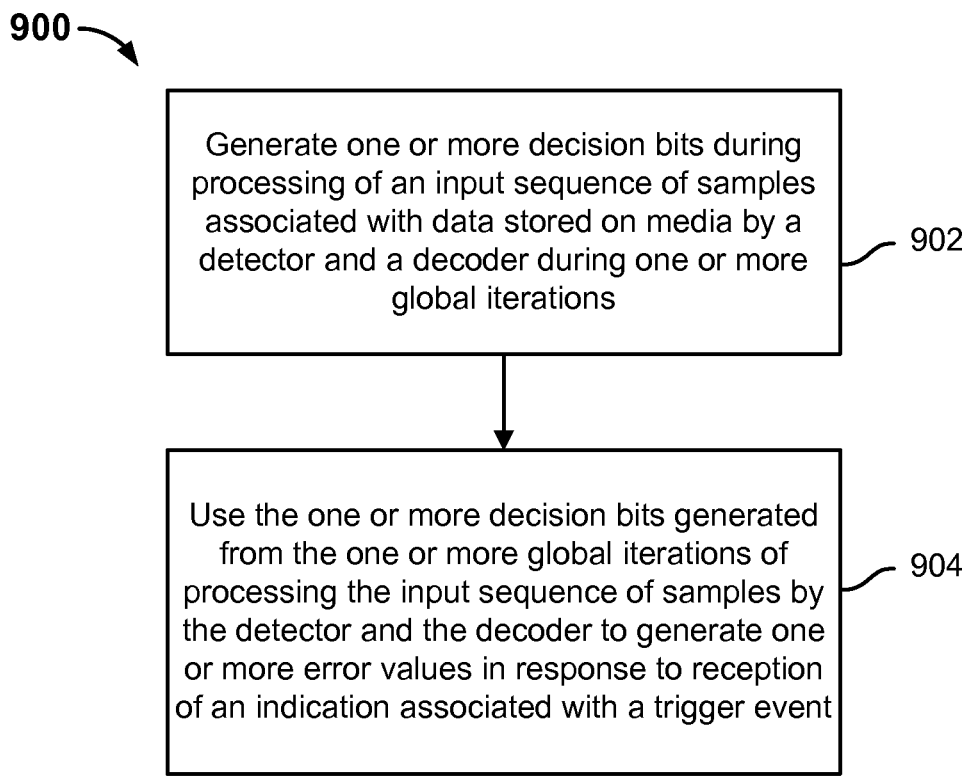
FIG. 9 is a flow diagram showing another embodiment of scheduling the generation of error data.

FIG. 9 is a flow diagram showing another embodiment of scheduling the generation of error data. In some embodiments, process 900 is implemented at system 200. In some embodiments, process 400 is implemented by process 900.

In some embodiments, system 200 is configurable to schedule the generation of error data in the manner described by process 900.

At 902, one or more decision bits are generated during processing of an input sequence of samples associated with data stored on media by a detector and a decoder during one or more global iterations.

In some embodiments, 902 is similar to 502.

At 904, the one or more decision bits generated from the one or more global iterations of processing the input sequence of samples by the detector and the decoder are used to generate one or more error values in response to reception of an indication associated with a trigger event.

In some embodiments, a trigger event to start error data generation during one or more global iterations of processing by the detector and decoder is configurable (e.g., by the user of the chip). Once the event occurs, an indication associated with the occurrence of the trigger event is received and error data generation is set to begin. So, prior to reception of such an indication, error data generation (and thus, error adaptation) does not begin. Examples of the trigger event can include the start of a particular global iteration (e.g., the trigger event is the beginning of the 7$^{th}$ global iteration), the reception of an indication of a certain type of feedback, and/or the invocation of a recovery procedure that is to be performed inline with at least a portion of a global iteration. An example of a recovery procedure can include the detection of a certain signal quality (e.g., the signal is detected to be too small) that triggers a modification to the signal (e.g., the gain of the signal that is detected to be too small is modified). For example, the invocation of an inline recovery procedure can also be configured to start at a particular global iteration, which may or may not be the same particular global iteration that is configured as the event to trigger the error data generation and adaptation. A recovery procedure can include, for example, further processing to the input sequence of samples in addition to processing them through one or more global iterations. For example, during a recovery procedure, further noise reduction processing can be applied to the input sequence of samples before the sequence is input into a detector and decoder for a global iteration of processing.

In some embodiments, once the trigger event occurs, error data generation and adaptation of input samples to be fed into the detector and/or decoder to the error data are continuously performed until the decoder determines that further global iterations will not be performed (e.g., the decoder determines that the input sequence has been correctly decoded). In some embodiments, the time schedule at which error data is generated and then used for adaptation can be configured to be either prior to the completion of each global iteration (as described at least in part by process 500) or subsequent to the completion of each global iteration (as described at least in part by process 700).

One benefit to using process 900 is that the system administrator (e.g., a user of the chip) can configure when to start error data generation so the system administrator can determine whether it is more preferable to start error data generation and adaption sooner (e.g., to start error data generation after the end of the first global iteration if the data is not successfully decoded yet) to accomplish successful data decoding faster or to save more power (e.g., to start error data generation only when it seems that the data will likely not become successfully decoded without error data generation and adaptation, such as when after several global iterations, the decoder still determines that the input sequence of samples is uncorrectable).

Figure 10:
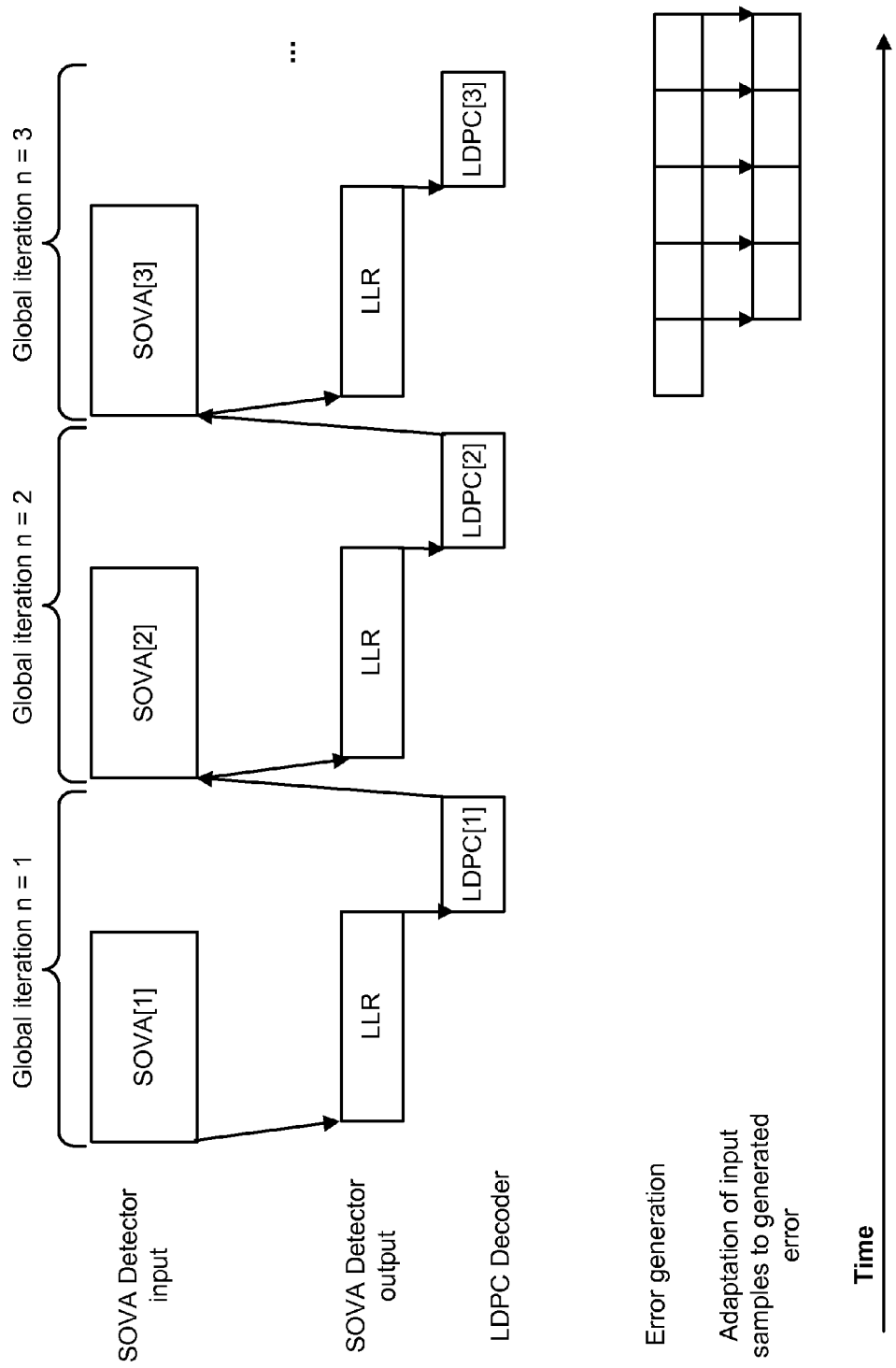
FIG. 10 is an embodiment of a time schedule diagram showing error data generation as described by process 900 and also the use of generated error data to adapt the input sequence of samples.

FIG. 10 is an embodiment of a time schedule diagram showing error data generation as described by process 900 and also the use of generated error data to adapt the input sequence of samples. In some embodiments, the example is implemented at system 200. In the example, the detector comprises a SOVA detector and the decoder comprises a LDPC decoder.

In the example, the trigger event to start error data generation and adaptation is configured to be the start of the global iteration n when n=3. Put another way, in this example, error data generation and adaptation are triggered to begin if the input sequence of samples is not correctly decoded after two global iterations of processing by the SOVA detector and LDPC decoder.

As shown in the diagram, at the start of global iteration n=1, an input sequence of samples (e.g., retrieved from memory) is input in the SOVA detector for processing (SOVA [1]). Then the decision outputs from the SOVA[1] (LLR) are input into the LDPC for processing (LDPC[1]). At the completion of global iteration n=1, the input sequence of samples is not determined to be correctable by the LDPC decoder and so global iteration n=2 begins. However, since the trigger event to start error data generation and adaptation is configured to be the start of global iteration n=3, error data generation and adaptation do not take place during global iteration n=1 nor global iteration n=2. At the completion of global iteration n=1, the input sequence of samples is not determined to be correctable by the LDPC decoder and so global iteration n=2 begins. At the completion of global iteration n=2, the input sequence of samples is not determined to be correctable by the LDPC decoder and so global iteration n=3 begins. The start of global iteration n=3 is the event in this example that triggers the start of the generation of error data and then adaptation of the input sequence of samples to be fed into the SOVA detector and the LDPC decoder. In the example, once error data generation and adaptation are triggered, the error data generation and adaptation are to take place prior to the completion of each global iteration, such as described in process 500 and FIG. 6. Iterative error data generation and then adaptation will then continue until, for example, the decoder determines that no further global iterations need be performed.

Figure 11:
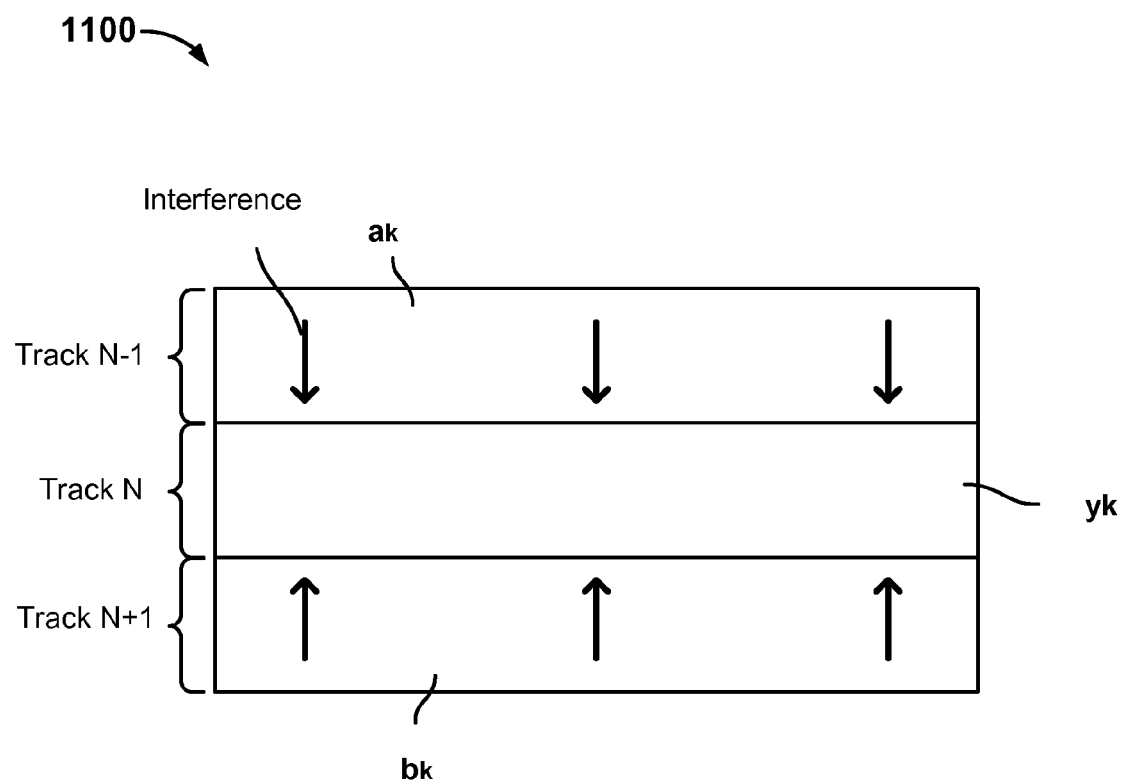
FIG. 11 is a diagram of an example of adjacent tracks.
Figure 12:
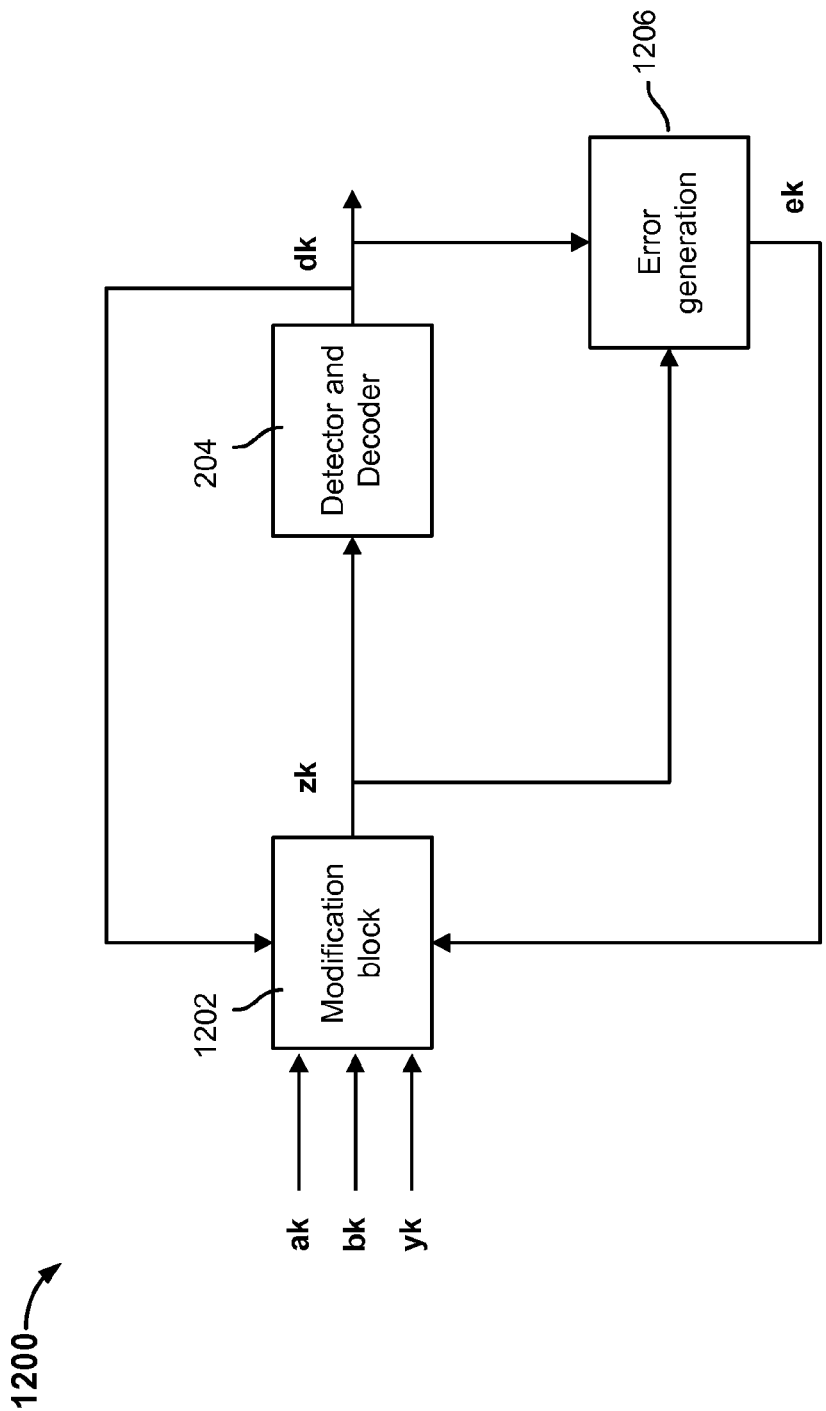
FIG. 12 is a diagram of an embodiment of a system for cancelling ITI from read data, with error data generation and also the adaptation of the ITI-cancelled data to the generated error data.
Figure 13:
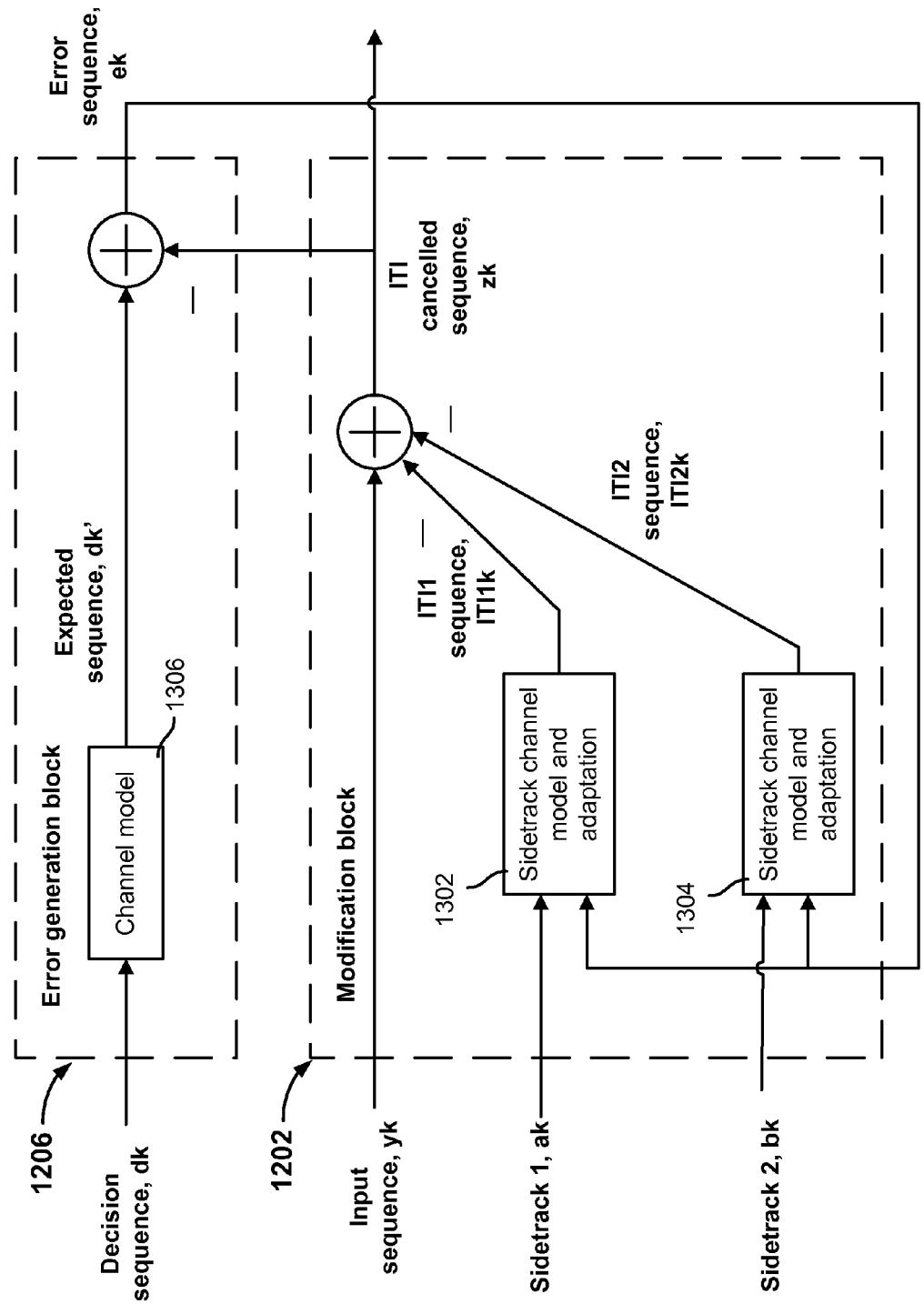
FIG. 13 is a diagram showing an embodiment of a modification block and an embodiment of an error generation block.

FIGS. 11, 12, and 13 are diagrams used to describe an example application of the error data generation and adaptation techniques as described above to the procedure of inter-track-interference (ITI) cancellation.

FIG. 11 is a diagram of an example of adjacent tracks. In the example, the tracks (Track N−1, Track N, and Track N+1) are tracks on a hard disk. For example, the three tracks can be associated with shingle magnetic recording (SMR), in which adjacent tracks partially overlap like shingles on a roof. One advantage to arranging tracks closely (or even in an overlapping fashion) is to increase track density on a platter. However, one disadvantage of layering tracks closely is a possible increase in inter-track-interference (ITI), which is the distortion to the signal of one track that is caused by the collective intersymbol interference (ISI) of symbols of another track (e.g., a track adjacent to the first track). ITI, which has a similar effect as noise, can cause the read signal of a track to be less reliable (e.g., more prone to error during data recovery and/or less likely to be decodable).

In the example, Track N has adjacent tracks Track N−1 and Track N+1. The data to be read from Track N is affected by the inter-track-interference from Track N−1 and Track N+1. In the example, Track N is to be read and so the data associated with Track N is still unknown data (e.g., until the data from Track N is processed and determined to be decodable). However, it is assumed that either or both adjacent tracks, Track N−1 and Track N+1, have already been read and successfully decoded (e.g., the data associated with Track N−1 and Track N+1 are now known). The successfully decoded data (e.g., output bit sequence) associated with Track N−1 is ak and the successfully decoded data associated with Track N+1 is bk.

To improve the Sector-Failure-Rate (SFR) associated with the reading of Track N, the ITI of either or both of adjacent tracks Track N−1 and Track N+1 can be cancelled from the read back data associated with Track N. In various embodiments, the procedure to remove ITI from the received signal associated with a track to be read includes two parts. The first part, which is herein referred to as ITI correlation, is to correlate (e.g., cross correlate) the received signal with known data associated with one or both adjacent tracks to produce one or more correlation coefficients. The second part, which is herein referred to as ITI cancellation is to cancel the ITI information from one or both adjacent tracks using the correlation results from the first part.

In some embodiments, the ITI removal procedure can apply to a data recovery operation (e.g., the ITI removal procedure is performed during a recovery procedure additional to the detecting and decoding processes of certain data sectors) and/or to an on-the-fly detecting and decoding operation (e.g., the ITI removal procedure is performed in parallel to at least one global iteration of processing a received signal).

FIG. 12 is a diagram of an embodiment of a system for cancelling ITI from read data, with error data generation and also the adaptation of the ITI-cancelled data to the generated error data. In some embodiments, system 1200 is configured to be associated with a hard drive controller. For example, system 200 is used to read data from media such as hard disk. In the example, a signal received for a data sector being read is processed by an analog process (not shown) and then equalized (e.g., by one or more filters) to become yk, an input sequence of samples. In some embodiments, system 1200 is a specific implementation of system 200, where yk represents the input sequence of samples derived from the read back signal of a data sector associated with a particular track (e.g., Track N of FIG. 11). Input sequence of samples yk associated with Track N is to be decoded, and sidetrack sequences ak and bk are known/correct data associated with each of the two sidetracks, Track N−1 and Track N+1, respectively, of Track N. Sidetrack sequences ak and bk are to be used to model the ITI samples from the two sidetracks, Track N−1 and Track N+1, that negatively affect the successful decoding of input sequence of samples yk associated with Track N. Once the ITI samples are computed for one or both side tracks, such ITI samples can be cancelled from input sequence of samples yk to produce ITI cancelled sequence zk.

In some embodiments, parameters associated with system 1200 and/or the hard disk controller thereof can be configured to determine if/when ITI cancellation is to be performed with respect to one or more global iterations of detecting and decoding input sequence of samples yk. In some embodiments, parameters associated with system 1200 and/or the hard disk controller thereof can also be configured to determine if/when error data generation and/or adaptation is to be performed with respect to one or more global iterations of detecting and decoding input sequence of samples yk (if ITI cancellation has not begun) or ITI cancelled sequence zk (if ITI cancellation has already begun). In various embodiments, if/when error data generation and adaptation in system 1200 is to be performed can be configured to be by the time schedules as described by FIGS. 5-10.

For illustrative purposes, in the description of process 1200 below, it is assumed that both ITI cancellation and error data generation/adaptation are being performed.

Modification block 1202 is configured to model the ITI samples from one or both sidetracks of the track associated with input sequence of samples yk. For example, one or both of sidetrack sequences ak and bk are to be used by modification block 1202 to model the ITI samples associated with sidetracks Track N−1 and Track N+1. Modification block 1202 is configured to use error sequence ek generated from error generation block 1206 to adapt the computed ITI samples from one or both sidetracks. Modification block 1202 is then configured to cancel the error adapted ITI samples from one or both sidetracks from input sequence of samples yk to produce ITI cancelled sequence zk. Then, ITI cancelled sequence zk would be fed into detector and decoder 204 for processing and the output of the processing, decision sequence dk, would be fed back into error generation block 1206 to produce better error data, error sequence ek, to be used to correct the computed ITI samples to be cancelled from the input samples to be detected/decoded over a subsequent global iteration.

Error generation block 1206 is configured to generate error sequence ek from decision sequence dk output by detector and decoder 204 and ITI cancelled sequence zk, as bits of decision sequence dk become available.

As such, each successive iteration of ITI cancelled sequence zk will be more accurate than that processed by the previous global iteration by virtue of the removal of ITI and also having the computed ITI samples being iteratively corrected with the error data generated from the decision bits from a previous global iteration of detector and decoder processing. Whereas cancelling computed ITI samples from input sequence of sample yk alone would have improved the likelihood that the data would be successfully decoded, the additional iterative improvement of the computed ITI samples would further improve the accuracy of the data to be detected and decoded over one or more global iterations.

In some embodiments, detector and decoder 204 continuously processes ITI cancelled sequence zk over one global iteration after another but stops when the decoder of detector and decoder 204 determines that the data is successfully decoded, in which case error generation block 1206 and modification block 1202 are also configured to stop processing.

FIG. 13 is a diagram showing an embodiment of a modification block and an embodiment of an error generation block. In some embodiments, error generation block 1206 of system 1200 is implemented using the embodiment of the error generation block of FIG. 13. In some embodiments, modification block 1202 of system 1200 is implemented using the embodiment of the modification block of FIG. 13.

For the example error generation block, the two inputs are decision sequence dk (that is received from a detector and decoder such as detector and decoder 204 of systems 200 and 1200) and ITI cancelled sequence zk. Decision sequence dk is fed into channel model 1306. Channel model 1306 can be linear (e.g., a filter) or non-linear (e.g., a look-up table). In some embodiments, channel model 1306 is configured to use one or more bits of decision sequence dk to generate each bit of expected sequence dk'. For example, channel model 1306 can use a sliding window of bits of decision sequence dk to generate each bit of expected sequence dk'. In this example, error sequence ek is produced by taking the difference of the determined expected sequence dk' and ITI cancelled sequence zk.

For the example modification block, the four inputs into the modification block are input sequence of samples yk (e.g., the samples could be read from a memory), sidetrack 1 sequence ak (e.g., the samples could be read from a media data memory), sidetrack 2 sequence bk (e.g., the samples could be read from a media data memory), and error sequence ek (received from error generation block 1206). In this example, assume that input sequence of samples yk were associated with center track, Track N, and that sidetrack 1 sequence ak is associated with sidetrack Track N−1 and sidetrack 2 sequence bk is associated with the other sidetrack, Track N+1. Sidetrack channel model and adaptation 1302 is configured to generate ITI sequence ITI1k associated with Track N−1 and sidetrack channel model and adaptation 1304 is configured to generate ITI sequence ITI2k associated with Track N+1. In some embodiments, sidetrack channel model and adaptation 1302 and sidetrack channel model and adaptation 1304 are two instances of the same logic block. In some embodiments sidetrack channel model and adaptations 1302 and 1304 are implemented at least in part using FIR filters. For example, sidetrack channel model and adaptation 1302 is configured to first generate coefficients C1m (not shown) by correlating sidetrack 1 sequence ak and error sequence ek. Sidetrack channel model and adaptation 1302 is configured to then compute ITI sequence ITI1k using sidetrack 1 sequence ak and the generated coefficients, C1m. Similarly, sidetrack channel model and adaptation 1304 is configured to first generate coefficients C2m by correlating sidetrack 2 sequence bk and error sequence ek, and then computing ITI sequence ITI2k using sidetrack 2 sequence bk and the generated coefficients, C2m. In some embodiments, only one of ITI sequence ITI1k and ITI sequence ITI2k is computed. In some other embodiments, both of ITI sequence ITI1k and ITI sequence ITI2k are computed. The computed ITI samples (either one or both of ITI sequence ITI1k and ITI sequence ITI2k) are then cancelled from input sequence of samples yk to generate ITI cancelled sequence zk. ITI cancelled sequence zk will then be fed into a detector and decoder such as detector and decoder 204 of systems 200 and 1200.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of generating error data associated with decoding data, comprising:
processing a first portion of an input sequence of samples associated with data stored on media using a detector and a decoder over a global iteration to generate a first set of decision bits;
generating one or more error values prior to the completion of the global iteration based at least in part on the first set of decision bits output by the detector or the decoder and the input sequence of samples, wherein generating the one or more error values includes:
generating an expected sequence based at least in part on the first set of decision bits; and
generating the one or more error values based at least in part on the input sequence and the expected sequence;
determining a second portion of the input sequence of samples that has not yet been processed by the detector and the decoder over the global iteration; and
using the one or more error values to modify at least the second portion of the input sequence of samples prior to inputting the second portion of the input sequence into the detector over the global iteration of processing using the detector and the decoder.

2. The method of claim 1, wherein the media comprises hard disk.

3. The method of claim 1, wherein the input sequence of samples is associated with a data sector.

4. The method of claim 1, wherein the detector comprises a soft-output Viterbi algorithm (SOVA) detector.

5. The method of claim 1, wherein the decoder comprises a low-density parity-code (LDPC) decoder.

6. The method of claim 1, further comprising performing inter-track interference (ITI) cancellation on at least the second portion of the input sequence of samples.

7. The method of claim 6, further comprising using the one or more error values to modify one or more computed ITI samples to cancel from the at least second portion of the input sequence of samples.

8. The method of claim 1, further comprising receiving an indication associated with a trigger event configured to start error data generation, wherein the trigger event is configurable by a user.

9. The method of claim 8, wherein the trigger event comprises one or more of the following: a start of a specific global iteration, a receipt of an indication associated with a specified type of feedback, and an invocation of a recovery procedure.

10. A system for generating error data associated with decoding data, comprising:
one or more processors configured to:
process a first portion of an input sequence of samples associated with data stored on media using a detector and a decoder over a global iteration to generate a first set of decision bits;
generate one or more error values prior to the completion of the global iteration based at least in part on the first set of decision bits output by the detector or the decoder and the input sequence of samples, wherein to generate the one or more error values includes to:
generate an expected sequence based at least in part on the first set of decision bits; and
generate the one or more error values based at least in part on the input sequence and the expected sequence;

determine a second portion of the input sequence of samples that has not yet been processed by the detector and the decoder over the global iteration; and use the one or more error values to modify at least the second portion of the input sequence of samples prior to inputting the second portion of the input sequence into the detector over the global iteration of processing using the detector and the decoder; and a memory coupled to the one or more processors and configured to provide the one or more processors with instructions.

11. The system of claim 10, wherein the one or more processors are further configured to receive an indication associated with a trigger event configured to start error data generation, wherein the trigger event is configurable by a user.

12. The system of claim 11, wherein the trigger event comprises one or more of the following: a start of a specific global iteration, a receipt of an indication associated with a specified type of feedback, and an invocation of a recovery procedure.

13. The system of claim 10, wherein the one or more processors are further configured to perform inter-track interference (ITI) cancellation on at least the second portion of the input sequence of samples.

14. The system of claim 13, further comprising using the one or more error values to modify one or more computed ITI samples to cancel from the at least second portion of the input sequence of samples.

15. A computer program product for generating error data associated with decoding data, the computer program product being embodied in a non-transitory computer readable medium and comprising computer instructions for:

processing a first portion of an input sequence of samples associated with data stored on media using a detector and a decoder over a global iteration to generate a first set of decision bits;

generating one or more error values prior to the completion of the global iteration based at least in part on the first set of decision bits output by the detector or the decoder and the input sequence of samples, wherein generating the one or more error values includes:

generating an expected sequence based at least in part on the first set of decision bits; and generating the one or more error values based at least in part on the input sequence and the expected sequence;

determining a second portion of the input sequence of samples that has not yet been processed by the detector and the decoder over the global iteration; and using the one or more error values to modify at least the second portion of the input sequence of samples prior to inputting the second portion of the input sequence into the detector over the global iteration of processing using the detector and the decoder.

16. The computer program product of claim 15, further comprising receiving an indication associated with a trigger event configured to start error data generation, wherein the trigger event is configurable by a user.

17. The computer program product of claim 16, wherein the trigger event comprises one or more of the following: a start of a specific global iteration, a receipt of an indication associated with a specified type of feedback, and an invocation of a recovery procedure.

18. The computer program product of claim 15, further comprising performing inter-track interference (ITI) cancellation on at least the second portion of the input sequence of samples.

19. The computer program product of claim 18, further comprising using the one or more error values to modify one or more computed ITI samples to cancel from the at least second portion of the input sequence of samples.

* * * * *